(12) United States Patent
Shibue

(10) Patent No.: US 6,958,259 B2
(45) Date of Patent: Oct. 25, 2005

(54) METHOD OF STACKING SEMICONDUCTOR ELEMENT IN A SEMICONDUCTOR DEVICE

(75) Inventor: Hitoshi Shibue, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/919,033

(22) Filed: Aug. 16, 2004

(65) Prior Publication Data

US 2005/0017340 A1 Jan. 27, 2005

Related U.S. Application Data

(62) Division of application No. 10/052,078, filed on Jan. 17, 2002, now Pat. No. 6,803,646.

(30) Foreign Application Priority Data

Jan. 26, 2001 (JP) ............................ P2001-017800

(51) Int. Cl.[7] ............................................ H01L 21/44
(52) U.S. Cl. ....................... 438/108; 438/127; 257/778
(58) Field of Search ................................. 438/106, 108, 438/127; 257/778

(56) References Cited

U.S. PATENT DOCUMENTS

| | | | |
|---|---|---|---|
| 5,977,640 A | 11/1999 | Bertin et al. | |
| 6,110,755 A | 8/2000 | Muramatsu et al. | |
| 6,400,036 B1 | 6/2002 | Tang et al. | |
| 6,664,643 B2 * | 12/2003 | Emoto | ........................ 257/777 |
| 2003/0045029 A1 | 3/2003 | Emoto | |

* cited by examiner

Primary Examiner—Brad Smith
(74) Attorney, Agent, or Firm—Sonnenschein, Nath & Rosenthal LLP

(57) ABSTRACT

The present invention provides a semiconductor device including a first semiconductor element to be bonded to a wiring board in a flip-chip bonding manner, a resin peripheral wall provided on the wiring board in such a manner as to surround the first semiconductor element, a sealing resin poured so as to fill a space surrounded by the resin peripheral wall and then hardened, and a second semiconductor element provided in such a manner that a back surface thereof is fixed on an upper surface of the sealing resin and a electrode provided on a front surface thereof is connected to a segment of wiring on the wiring board by means of a bonding wire, and provides a method of fabricating the semiconductor device. With this configuration, since semiconductor elements of arbitrary outer sizes can be stacked to each other without any limitation by the outer sizes of the semiconductor elements, even in a combination of any outer shapes of semiconductor elements vertically stacked to each other, the semiconductor elements can be mounted at a high density.

2 Claims, 2 Drawing Sheets

US 6,958,259 B2

METHOD OF STACKING SEMICONDUCTOR ELEMENT IN A SEMICONDUCTOR DEVICE

This is a divisional of U.S. application Ser. No. 10/052,078 filed Jan. 17, 2002, which has issued as U.S. Pat. No. 6,803,646 on Oct. 12, 2004 and which claim priority to Japanese Application No. P2001-017800 filed Jan. 26, 2001, all of which are incorporated herein by reference to the extent permitted by law.

BACKGROUND OF THE INVENTION

The present invention relates to a semiconductor device including a plurality of semiconductor elements stacked to each other and a method of fabricating the semiconductor device, and particularly to a technique capable of stacking semiconductor elements to each other without any limitation by outer sizes of the semiconductor elements.

If one semiconductor element is mounted on a wiring board, then an area of the wiring board is occupied with the semiconductor device, and thereby another semiconductor element is no longer mounted on the wiring board. On the other hand, in recent years, electronic devices such as video cameras, CDs, and cellular phones have been required to be further reduced in size and further enhanced in performance. To meet such a requirement, there has been proposed a semiconductor device, in which a semiconductor element mounting area becomes twice that of a prior art semiconductor device although the semiconductor device uses the same wiring board as that used for the related art semiconductor device.

For example, a related art semiconductor device 1 shown in FIG. 4 includes two semiconductor elements 3 and 5, wherein a surface (back surface) 9 opposed to an electric connection surface 7 of the semiconductor element 3 is superimposed to a surface (back surface) 13 opposed to an electric connection surface 11 of the other semiconductor element 5 and is bonded thereto by means of adhesive 15, and the electric connection surface 11 of the upper semiconductor element 5 is electrically connected to segments of wiring on a wiring board 19 by means of bonding wires 17 while the electric connection surface 7 of the lower semiconductor element 3 is electrically connected to segments of the wiring on the wiring board 19 by means of bumps 23.

Another related art semiconductor device 25 shown in FIG. 5 includes two semiconductor elements 27 and 29, in which a surface (back surface) 33 opposed to an electric connection surface 31 of the semiconductor element 27 is die-bonded to a wiring board 19 by means of adhesive 15 and electrodes of the semiconductor element 27 are electrically connected to segments of wiring on the wiring board 19 by means of bonding wires 17, and the other semiconductor element 29 is bonded, in a flip-chip bonding manner, to a front surface of the semiconductor element 27 by means of bumps 35.

With each of the semiconductor devices 1 and 25, a mounting density of the semiconductor device becomes twice that of a conventional semiconductor device in which a mounting area is occupied with one semiconductor element. Accordingly, it is possible to miniaturize an electronic device using the semiconductor device.

The related art semiconductor device 1 shown in FIG. 4, however, has an inconvenience that an outer size of the lower layer semiconductor element must be larger than an electrode area, in which electrodes are disposed, of the upper layer semiconductor element. The reason for this is as follows: namely, at the time of connecting the bonding wires to respective electrodes of the upper layer semiconductor element, some support is required to be disposed directly under each of the electrodes of the upper layer semiconductor element. If such a support is not provided (that is, in an overhang state), when the bonding wire is connected to each electrode of the upper layer semiconductor element, a mechanical load is partially applied to the upper layer semiconductor element, resulting in breakage of the upper layer semiconductor element.

The related art semiconductor device 25 shown in FIG. 5 has also an inconvenience that since the bonding wires must be connected to the lower layer semiconductor element, an outer size of the upper layer semiconductor element is required to be smaller than an electrode area, in which the electrodes are disposed, of the lower layer semiconductor element.

Accordingly, in each of the above-described related art semiconductor devices, there is a limitation to a relationship between the outer sizes of the lower layer semiconductor element and the upper layer semiconductor element. As a result, depending on a combination of outer sizes of semiconductor elements, the semiconductor devices cannot be stacked to each other, thereby failing to realize high density mounting of the semiconductor elements.

SUMMARY OF THE INVENTION

An object of the present invention is to provide a semiconductor device capable of mounting semiconductor elements of arbitrary outer sizes to each other without any limitation by the outer sizes of the semiconductor elements, thereby realizing, even in a combination of any outer shapes of semiconductor elements vertically stacked to each other, high density mounting of the semiconductor elements, and to provide a method of fabricating the semiconductor device.

To achieve the above object, according to a first aspect of the present invention, there is provided a semiconductor device including: a first semiconductor element to be bonded to a wiring board in a flip-chip bonding manner; a resin peripheral wall formed on the wiring board in such a manner as to surround the first semiconductor element; a sealing resin poured so as to fill a space surrounded by the resin peripheral wall and then hardened; and a second semiconductor element provided in such a manner that a back surface thereof is fixed on an upper surface of the sealing resin and an electrode provided on a front surface thereof is connected to a segment of wiring on the wiring board by means of a bonding wire.

With this configuration, even if an outer size of the second semiconductor element is larger than that of the first semiconductor element, the second semiconductor element can be placed on the sealing resin. Accordingly, in the bonding step, a mechanical load applied to the second semiconductor element is supported by the sealing resin, so that it is possible to prevent occurrence of breakage of the second semiconductor element. As a result, the second semiconductor element of an arbitrary outer size can be stacked on the first semiconductor element without any limitation by the outer size of the first semiconductor element. That is to say, even in a combination of any outer shapes of semiconductor elements vertically stacked to each other, the semiconductor elements can be mounted at a high density.

In this semiconductor device, preferably, a portion, in the thickness direction, of the second semiconductor element is buried in the sealing resin, and the back surface of the second semiconductor element is supported on the back surface of the first semiconductor element via the sealing resin, and the front surface of the second semiconductor element is projected from the upper surface of the sealing resin.

With this configuration, since a portion, in the thickness direction, of the second semiconductor element is buried in the sealing resin, an adhesive strength of the second semiconductor element to the sealing resin can be improved. Also since the back surface of the second semiconductor element is supported on the back surface of the first semiconductor element via the sealing resin, it is possible to prevent the second semiconductor element from being excessively buried in the sealing resin and hence to realize accurate positioning of the second semiconductor element in the height direction. Further since the front surface of the second semiconductor element projects from the front surface of the sealing resin, it is possible to prevent electrodes provided on the front surface of the second semiconductor element from being covered with the sealing resin.

According to a second aspect of the present invention, there is provided a method of fabricating a semiconductor device, including the steps of: bonding a first semiconductor element on a wiring board in a flip-chip bonding manner; forming a resin peripheral wall on the wiring board in such a manner that the first semiconductor element is surrounded by the resin peripheral wall; filling a space surrounded by the resin peripheral wall with a liquid sealing resin; fixing a back surface of a second semiconductor element on an upper surface of the sealing resin; and connecting a electrode provided on a front surface of the second semiconductor element to a segment of wiring on the wiring board by means of a bonding wire after fixture of the second semiconductor element on the sealing resin.

With this configuration, after the resin peripheral wall is formed on the wiring board in such a manner as to surround the first semiconductor element, the space surrounded by the resin peripheral wall is filled with the sealing resin. Accordingly, the sealing resin containing the first semiconductor element and having the outer shape defined by the resin peripheral wall is formed into a bed plate shape on the wiring board, wherein an upper surface of the sealing resin is taken as a mounting surface for supporting the second semiconductor element, and the second semiconductor element is fixed on the upper surface of the sealing resin. As a result, the second semiconductor element can be supported by the sealing resin irrespective of an outer size of the first semiconductor element. That is to say, it is possible to fabricate the semiconductor device in which semiconductor elements of any shapes are allowed to be stacked to each other in the vertical direction.

The above step of fixing the second semiconductor element on the upper surface of the sealing resin is preferably carried out by placing the back surface of the second semiconductor element on the upper surface of the sealing resin before perfect hardening of the sealing resin and after the sealing resin becomes hard by a prescribed level.

With this configuration, before perfect hardening of the sealing resin and after the sealing resin becomes hard by a prescribed level, the second semiconductor element is placed on the upper surface of the sealing resin and is fixed thereto. In other words, at the same time when the sealing resin is perfectly hardened, the second semiconductor element is fixed to the sealing resin. Accordingly, it is possible to eliminate the need of special-purpose adhesive for fixing in the case of fixing the second semiconductor element to the sealing resin after perfect hardening.

A viscosity of a resin filled as the sealing resin is preferably lower than a viscosity of a resin used for forming the resin peripheral wall.

With this configuration, since the viscosity of the sealing resin is lower than the viscosity of the resin used for forming the resin peripheral wall, it is possible to increase a filing ratio of the sealing resin in the space of the resin peripheral wall. Conversely, since the viscosity before hardening of the resin used for forming the resin peripheral wall is higher than the viscosity before hardening of the sealing resin, it is possible to prevent flow-out of the sealing resin from the resin peripheral wall.

DETAILED DESCRIPTION OF THE PREFERRED EMBODIMENTS

Hereinafter, preferred embodiments of a semiconductor device and a semiconductor device structure will be described in detail with reference to the drawings.

Figure 1:
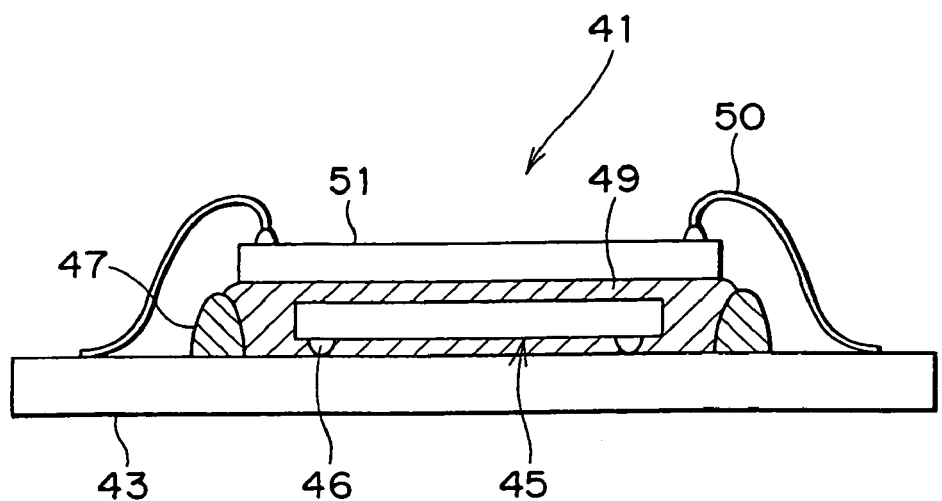
FIG. 1 is a sectional view of a semiconductor device of the present invention.
Figure 2A:
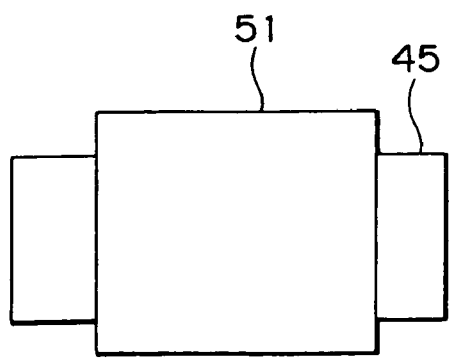
FIGS. 2A and 2B are views each illustrating a combination example of outer sizes of semiconductor elements.
Figure 2B:
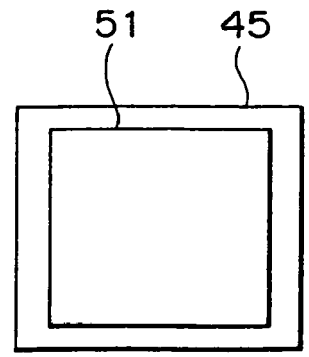
Figure 3:
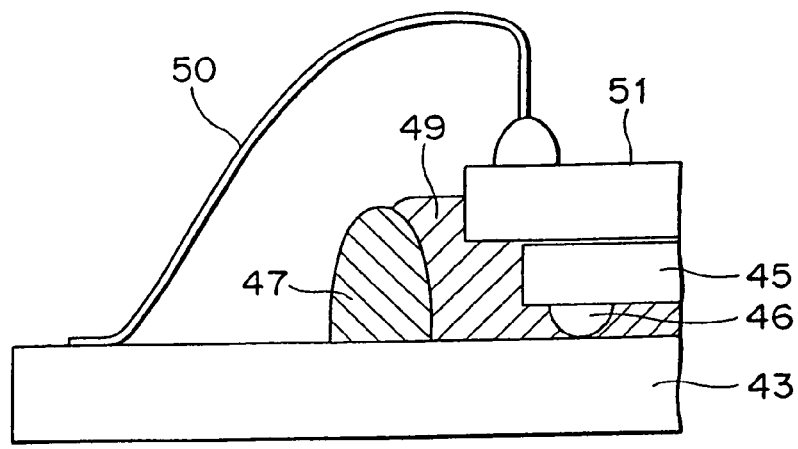
FIG. 3 is an enlarged sectional view of an essential portion of a modification of the semiconductor device shown in FIG. 1.
Figure 4:
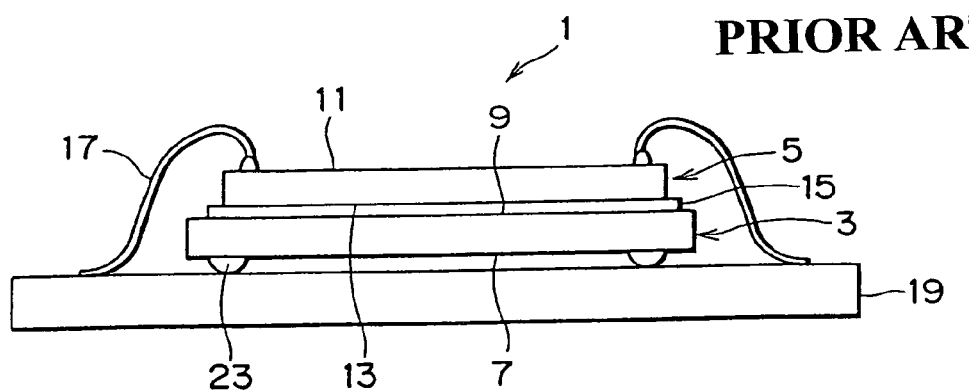
FIG. 4 is a sectional view of a related art high density mounting type semiconductor device in which bonding wires are connected to an upper layer semiconductor element.
Figure 5:
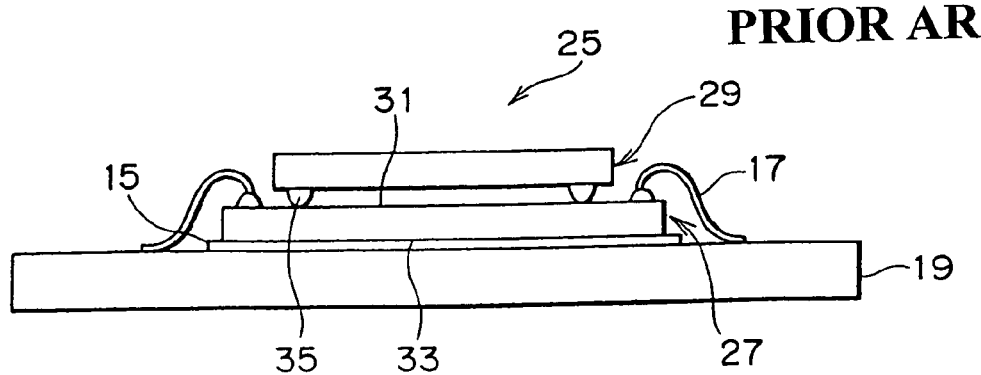
FIG. 5 is a sectional view of another related art high density mounting type semiconductor device in which bonding wires are connected to a lower layer semiconductor element.

FIG. 1 is a sectional view of a semiconductor device of the present invention; FIGS. 2A and 2B are views each illustrating a combination example of outer sizes of semiconductor elements; and FIG. 3 is an enlarged sectional view of an essential portion of a modification of the semiconductor device shown in FIG. 1.

In a semiconductor device 41 according to this embodiment, a first semiconductor element (lower layer semiconductor element) 45 is bonded, in a flip-chip bonding manner, to a wiring board 43 by means of bumps 46. A resin peripheral wall 47 is formed on the wiring board 43 in such a manner as to surround the first semiconductor element 45. The shape of the resin peripheral wall 47 is determined by an electrode area of a second semiconductor element (which will be described later). In other words, the resin peripheral wall 47 is formed in such a shape that the electrode area of the second semiconductor element is disposed within the resin peripheral wall 47. Accordingly, it is not required that the outer shape of the second semiconductor element is all disposed within the resin peripheral wall 47. That is to say, a portion, other than the electrode area, of the second semiconductor element may be out of the resin peripheral wall 47 in an overhang state.

A sealing resin 49 is poured so as to fill a space in the resin peripheral wall 47, and is then hardened. A back surface of a second semiconductor element (upper layer semiconductor element) 51 is fixed on an upper surface of the sealing resin 49. Since the second semiconductor element 51 is placed on the sealing resin 49 before the sealing resin 49 is hardened, the sealing resin 49 functions as adhesive for fixing the second semiconductor element 51. Electrodes provided on a front surface of the second semiconductor element 51 are connected to segments of wiring on the wiring board 43 by means of bonding wires 50.

In addition, the second semiconductor element 51 may be adhesively bonded to the sealing resin 49 after the sealing resin 49 is perfectly hardened. In this case, special-purpose adhesive is applied between the sealing resin 49 and the second semiconductor element 51. With this configuration that the second semiconductor element 51 is fixed after perfect hardening of the sealing resin 49, it is possible to highly accurately ensure a height dimension and a parallelism of the second semiconductor element 51.

With this semiconductor device 41, as shown in FIG. 2A, even if an outer size of the second semiconductor element 51 is larger than that of the first semiconductor element 45, the second semiconductor element 51 can be placed on the sealing resin 49. Accordingly, in the bonding step, a mechanical load applied to the second semiconductor element 51 can be supported on the sealing resin 49, so that it is possible to prevent breakage of the second semiconductor element 51. As a result, the second semiconductor element 51 of any outer size can be stacked on the first semiconductor element 45 without any limitation by an outer size of the first semiconductor element 45. That is to say, even in a combination of any outer shapes of semiconductor elements vertically stacked to each other, the semiconductor elements can be mounted at a high density.

As shown in FIG. 2B, the semiconductor device 41 may be of course configured such that the second semiconductor element 51 having an outer size smaller than that of the first semiconductor element 45 is stacked on the first semiconductor element 45.

A modification of the above-described embodiment of the semiconductor device according to the present invention is shown in FIG. 3. In a semiconductor device shown in FIG. 3, a portion, in the thickness direction, of a second semiconductor element 51 is buried in a sealing resin 49 and a back surface of the second semiconductor element 51 is supported on a back surface of a first semiconductor element 45 via the sealing resin 49, and the second semiconductor element 51 projects from a front surface of the sealing resin 49.

According to this modification, since a portion, in the thickness direction, of the second semiconductor element 51 is buried in the sealing resin 49, it is possible to increase an adhesive strength of the second semiconductor element 51 to the sealing resin 49. Also since the back surface of the second semiconductor element 51 is supported on the back surface of the first semiconductor element 45 via the sealing resin 49, it is possible to prevent the second semiconductor element 51 from being excessively buried in the sealing resin 49, and hence to realize accurate positioning of the second semiconductor element 51 in the height direction. Further, since the front surface of the second semiconductor element 51 projects from the front surface of the sealing resin 49, it is possible to prevent electrodes and light receiving portions provided on the front surface of the second semiconductor element 51 from being covered with the sealing resin 49.

A procedure of fabricating the semiconductor device 41 according to this embodiment will be hereinafter described. A first semiconductor element 45 is bonded, in a flip-chip bonding manner, on a wiring board 43.

A resin peripheral wall 47 is formed on the wiring board 43 in such a manner as to surround the first semiconductor element 45.

A space in the resin peripheral wall 47 is filled with a liquid sealing resin 49.

A second semiconductor element 51 is fixed on an upper surface of the sealing resin 49.

After the second semiconductor element 51 is fixed to the sealing resin 49, electrodes provided on a front surface of the second semiconductor element 51 are connected to segments of wiring on the wiring board 43 by means of bonding wires 50.

The semiconductor device 41 is thus fabricated.

According to the above-described method of fabricating the semiconductor device 41, after the resin peripheral wall 47 is formed on the wiring board 43 in such a manner as to surround the first semiconductor element 45, the space in the resin peripheral wall 47 is filled with the sealing resin 49. Accordingly, the sealing resin 49 containing the first semiconductor element 45 and having the outer shape defined by the resin peripheral wall 47 is formed into a bed plate shape on the wiring board 43, wherein an upper surface of the sealing resin 49 is taken as a mounting surface for supporting the second semiconductor element 51, and the second semiconductor element 51 is fixed on the upper surface of the sealing resin 49. As a result, the second semiconductor element 51 can be supported by the sealing resin 49 irrespective of an outer size of the first semiconductor element 45. That is to say, it is possible to fabricate the semiconductor device 41 in which semiconductor elements of any shapes are allowed to be stacked to each other in the vertical direction.

In the above-described fabrication method, the step of fixing the second semiconductor element 51 on the upper surface of the sealing resin 49 may be carried out by placing, before perfect hardening of the sealing resin 49 and after emergence of a specific hardness of the sealing resin 49, the back surface of the second semiconductor element 51 on the upper surface of the sealing resin 49.

According to this configuration, at the same time when the sealing resin 49 is perfectly hardened, the second semiconductor element 51 is fixed to the sealing resin 49. As a result, it is possible to eliminate the need of special-purpose adhesive for fixing in the case of fixing the second semiconductor element 51 to the sealing resin 49 after perfect hardening. The wording "before perfect hardening" of the sealing resin 49 used here means a state before an adhesive force of the sealing resin 49 is lost, and the wording "specific hardness" means a hardness capable of supporting the second semiconductor element 51 in a state that the second semiconductor element 51 is floated up.

According to the fabrication method, a viscosity before hardening of the sealing resin 49 is preferably lower than a viscosity before hardening of a resin used for forming the resin peripheral wall 47. Under such a viscosity condition, it is possible to increase a filing ratio of the sealing resin 49 in the space of the resin peripheral wall 47, and also to prevent flow-out of the sealing resin 49 from the resin peripheral wall 47.

While the preferred embodiment of the present invention has been described using specific terms, such description is for illustrative purposes only, and it is to be understood that changes and variations may be made without departing from the spirit or scope of the following claims.

What is claimed is:

1. A method of fabricating a semiconductor device comprising the steps of:
   bonding a first semiconductor element on a wiring board in a flip-clip bonding manner;

forming a resin peripheral wall on said wiring board in such a manner that the first semiconductor element is surrounded by the resin peripheral wall;

filling a space surrounded by the resin peripheral wall with a liquid sealing resin;

fixing a back surface of a second semiconductor element on an upper surface of sealing resin; and connecting an electrode provided on a front surface of the second semiconductor element to a segment of wiring on the wiring board of means of a bonding wire after fixing of the second semiconductor element on the sealing resin, wherein said step of fixing the second semiconductor element on the upper surface of the sealing resin is carried out by placing the back surface of the second semiconductor element on the upper surface of the sealing resin before perfect hardening of the sealing resin and after sealing resin becomes hard by a prescribed level.

2. A method of fabricating a semiconductor element comprising the steps of:

bonding a first semiconductor element on a wiring board in a flip-clip bonding manner;

forming a resin peripheral wall on said wiring board in such a manner that the first semiconductor element is surrounded by the resin peripheral wall;

filling a space surrounded by the resin peripheral wall with a liquid sealing resin;

fixing a back surface of a second semiconductor element on an upper surface of sealing resin; and connecting an electrode provided on a front surface of the second semiconductor element to a segment of wiring on the wiring board of means of a bonding wire after fixing of the second semiconductor element on the sealing resin, wherein a viscosity of a resin filled as the sealing resin is lower than a viscosity of a resin used for forming the resin peripheral wall.

* * * * *